United States Patent [19]
Hosotani et al.

[11] Patent Number: 5,302,869
[45] Date of Patent: Apr. 12, 1994

[54] VOLTAGE COMPARATOR AND SUBRANGING A/D CONVERTER INCLUDING SUCH VOLTAGE COMPARATOR

[75] Inventors: Shiro Hosotani; Masao Ito, both of Hyogo, Japan

[73] Assignee: Mitsubishi Denki Kabushiki Kaisha, Tokyo, Japan

[21] Appl. No.: 952,421

[22] Filed: Sep. 29, 1992

[30] Foreign Application Priority Data

Oct. 3, 1991 [JP] Japan .................................. 3-256367

[51] Int. Cl.$^5$ ............................................. H03K 5/24
[52] U.S. Cl. .................... 307/518; 307/355; 307/360; 307/361
[58] Field of Search ............... 307/350, 360, 361, 362, 307/494, 243, 355, 518

[56] References Cited

U.S. PATENT DOCUMENTS

| | | | |
|---|---|---|---|
| 4,149,160 | 4/1979 | Bozarth et al. | 307/360 |
| 4,533,903 | 8/1985 | Yamada et al. | 307/361 |
| 4,542,370 | 9/1985 | Yamada et al. | 307/361 |
| 4,547,683 | 10/1985 | Bingham | 307/356 |
| 4,900,952 | 2/1990 | Hosotani et al. | 307/362 |
| 5,036,223 | 7/1991 | Sakai et al. | 307/362 |

FOREIGN PATENT DOCUMENTS

1-106527 4/1989 Japan.
2-193075 7/1990 Japan.

OTHER PUBLICATIONS

"A CMOS 40 MHz 8b 105 mW Two-Step ADC", by Noriyuki Fukushima et al., 1989 IEEE International Solid-State Circuits Conference, pp. 14–15.

"An 8-bit 20-MS/s CMOS A/D Converter with 50-mW Power Consumption", by Shiro Hosotani et al., IEEE Journal of Solid-State Circuits, vol. 25, No. 1, Feb. 1990, pp. 167–172.

*Primary Examiner*—William L. Sikes
*Assistant Examiner*—Shawn Riley
*Attorney, Agent, or Firm*—Lowe, Price, LeBlanc & Becker

[57] ABSTRACT

A voltage comparator for use in a subranging A/D converter includes a coarse preceding comparison circuit 30, a fine preceding comparison circuit 31, and an amplification circuit 32 having an automatic zero compensation function. The coarse preceding comparison circuit 30 compares an analog input voltage Vin and a coarse reference voltage Vai. The fine preceding comparison circuit 31 compares the analog input voltage Vin and a fine reference voltage Vbi. The coarse and fine preceding comparison circuits 30, 31 sequentially outputs comparison results to the amplification circuits 32 so that the comparison results do not overlap each other. The amplification circuits 32 resets offset voltages before amplifying the comparison results applied. The number of elements necessary for a subranging A/D converter can be reduced, and a voltage comparator operating at a high speed and highly accurately can be provided.

15 Claims, 16 Drawing Sheets

VOLTAGE COMPARATOR AND SUBRANGING A/D CONVERTER INCLUDING SUCH VOLTAGE COMPARATOR

BACKGROUND OF THE INVENTION

1. Field of the Invention

The present invention relates to a voltage comparator and a subranging A/D converter including such a voltage comparator.

2. Description of the Background Art

An A/D converter converts an analog signal to a digital signal. There are flash A/D converters, subranging A/D converters, etc. A subranging A/D converter A/D-converts an analog signal in two stages, i.e. stages of more significant bits and less significant bits. This subranging A/D converter has a smaller circuit scale and smaller power consumption as compared to a flash A/D converter. The subranging A/D converter is suited for installation in an LSI (Large Scale Integrated circuit) or a VLSI (Very Large Scale Integrated circuit) for this characteristic. This advantage of the series-parallel type has recently accelerated its development. An example of a subranging A/D converter as described above is presented in a document entitled "A CMOS 40 MHz 86 105 mW Two-Step ADC", IEEE ISSCC Dig. of Teach. Papers. pp. 14-15, 1989.

FIG. 12 is a block diagram showing the conventional subranging A/D converter disclosed in the above-stated document. The subranging A/D converter shown in FIG. 12 conducts A/D conversion of a total of m+n bits formed of more significant m bits and less significant n bits. Referring to FIG. 12, the subranging A/D converter includes a reference voltage generation circuit 1, coarse voltage comparators $A_0 - A_{k-1}$ ($k=2^m1$), a coarse encoder 2 for encoding m bits, fine voltage comparators $B_0 - B_{l-1}$ ($l \geq 2^n - 1$), a fine encoder 3 for encoding n bits, and an error correction circuit 4. The reference voltage generation circuit 1 has two input terminals 5 and 6 for applying reference voltages Vrt and Vrb, and an input terminal 7 for controlling a signal. The reference voltage generation circuit 1 has k coarse reference voltage output terminals $a_0 - a_{k-1}$ and l fine reference voltage output terminals $b_0 - b_{l-1}$ for outputting analog voltages based on these input voltages or input signals. The coarse voltage comparators $A_i$ ($i=0$ to $k-1$) each has 2 input terminals, one of which is connected together to an analog voltage application terminal 8, the other is connected to the coarse reference voltage output terminal $a_i$. The coarse encoder 2 has k input terminals connected to the outputs of k coarse voltage comparators $a_i$, a 4 bit encoder result output terminal for outputting an encoder result, and an output terminal for control. The terminal to output an encoder result is connected to the input terminal of the error correction circuit 4, the output terminal for control signal is connected to the input terminal for control signal 7 of the reference voltage generation circuit 1. As is the case with the coarse voltage comparator $A_i$, the fine comparators Bj ($j=0$ to $l-1$) each have 2 input terminals, one of which is connected together to the analog voltage application terminal 8, and the other is connected to the fine reference voltage output terminal $b_j$. The fine encoder 3 has l input terminals connected to the outputs of the fine voltage comparators $B_j$, an output terminal 9 for outputting an encode result of n bits, and an error detection signal output terminal 10 for outputting an error detection signal to the error correction circuit 4. The error correction circuit 4 has m input terminals connected to the output of coarse encoder 2, an input terminal connected to the error detection signal output terminal 10, and an output terminal 11 for outputting a final coarse encoder result of m bits which has been subjected to error correction.

An operation of the subranging A/D converter shown in FIG. 12 will be described. The subranging A/D converter operates in two stages, in other words in stages of coarse A/D conversion and fine A/D conversion. In the first stage, in other words in the coarse A/D conversion stage, each of the coarse voltage comparators $A_i$ compares an analog signal voltage Vin and a coarse reference voltage $Va_i$ output from the coarse reference voltage input terminal $a_i$. The coarse reference voltage $Va_i$ is usually obtained by dividing the two voltages Vrt and Vrb applied to the reference voltage application terminals 5 and 6 of the reference voltage generation circuit 1. Such reference voltage $Va_i$ and the analog signal voltage Vin are compared at the voltage comparator, and a range of voltage in which the analog voltage Vin exists is detected, and then a conversion into a desired code is conducted at the encoder 2. At the same time, a detection signal of the above-stated voltage range is applied to the control signal input terminal 7 of the reference voltage generation circuit 1.

In the second stage, in other words in the fine A/D conversion stage, a fine reference voltage $Vb_j$ to be output to the fine reference voltage application terminal $B_j$ is generated by the reference voltage generation circuit 1 based on a control signal. For example, if the presence of the analog signal voltage Vin between the coarse reference voltages $Va_i$ and $Va_{i+1}$ in the course of a coarse A/D conversion, a voltage further divided including both voltages is generated. Thus generated fine reference voltages $Vb_j$ are each input into one input end of a corresponding voltage comparator $B_j$. The analog signal voltage Vin is applied in common to the other input end of each of the voltage comparators $B_j$, comparison and encoding are conducted as is the case with the coarse A/D conversion operation, and finally a fine A/D conversion result in a desired code is output from the terminal 9. At the same time, a determination is made whether or not the range in which the analog signal voltage Vin detected in the fine A/D conversion exists coincide with that of the coarse A/D conversion result, and if no coincidence is found, a control signal is transferred to the error correction circuit 4 through the error detection signal output terminal 10. The error correction circuit 4, based on the control signal, corrects the coarse encoder result, and finally outputs a coarse A/D conversion result to the terminal 11.

FIG. 13 is a circuit diagram showing an example of a conventional 2-input voltage comparator. Referring to FIG. 13, in the voltage comparator, a coarse voltage comparator $A_i$ and a fine voltage comparator Bj are independently provided. The voltage comparator is controlled by clock signals $\phi_1 - \phi_{31}$ generated by a clock signal generation circuit 50 externally provided.

The coarse voltage comparator $A_i$ is formed of a series-connection of an input circuit 12, amplification circuits 13a and 14a of first and second stages having an automatic zero compensation function, and an inversion amplifier 15a. The input circuit 12 includes a switch S1 connected to an analog signal application terminal 8, and a switch S2 connected to a coarse reference voltage application terminal $a_i$. The switch S1 is turned on/off in response to the clock signal $\phi_1$. The switch S2 is turned on/off in response to the clock signal $\phi_2$. The output terminals of the switches S1 and S2 are connected together to the input end of the first stage amplification circuit 13. The first stage amplification circuit 13 includes a coupling capacitor Cc, an inversion amplifier 16, and a switch S3 connected between the input and output of the inversion amplifier 16. The coupling capacitor Cc has one end connected to the output of the input circuit 12 and the other end connected to the input of the inversion amplifier 16. The switch S3 is turned on/off in response to the clock signal $\phi_1$. When the switch S3 conducts, the output of the inversion amplifier 16 is fed back to the input of the amplifier 16. The second stage amplification circuit 14a has the same construction as that of the first amplification circuit 13.

As is the case with the coarse voltage comparator $A_i$, a fine voltage comparator $B_j$ is formed of a series-connection of an input circuit 17, first stage and second stage amplification circuits 13b and 14b, and an inversion amplifier 15b. An essential difference from the coarse voltage comparator $A_i$ is that the input circuit 17 is connected to the fine reference voltage output terminal $b_j$ (see FIG. 12), and the fine reference voltage output terminal $b_j$ is connected to the input end of the first stage amplification circuit 13b through a switch S4. The switch S4 is turned on/off in response to the clock signal $\phi_3$.

FIG. 14 is a representation showing the signal waveforms of the circuits shown in FIG. 13. The waveforms of $V_3$, $V_4$, $V_5$ indicated by the solid lines in FIG. 14 are voltage waveforms in the coarse comparison, while the waveforms of $V_3$, $V_4$, $V_5$ depicted by the chain dotted lines are voltage waveforms in the fine comparison. Referring to FIG. 14, a description of an operation of the coarse voltage comparator $A_i$ shown in FIG. 13 follows. In a period when the clock signal $\phi_1$ is in an "H" level (this period is referred to as an auto zero period), the switches S1 and S3 are turned on, while the switch S2 is turned off. With the switch S1 made conductive, the analog signal voltage Vin is applied to the first stage amplification circuit 13a. With the switch S3 made conductive, the outputs of the internal nodes N1 and N2 of first stage and second stage amplification circuits 13a and 14a are biased to the logic threshold voltage Vb of the inversion amplifier 16. Thus, charges are accumulated on the internal nodes N1 and N2 of the first stage and second stage amplification circuits 13a and 14a. Assuming that the accumulated charges are $Q_1$ and $Q_2$, respectively, and the parasitic capacitance of nodes N1 and N2 are Cs and Cs2, respectively, the following equations hold.

$$Q_1 = PCc(Vb - V_{in}) + C_{s1}Vb \qquad (1)$$

$$Q_2 = PCc(Vv - V_b) + C_{S2}Vb \qquad (2)$$

At the same time, the output of the inversion amplifier 15a is also biased to the threshold Vb.

In a period when the clock signal $\phi_2$ is in an "H" level (this period is referred to as coarse comparison period), the switch S2 is turned on; while the switches S1 and S3 are turned off. With the switch S3 conducting, the first stage and second stage amplification circuits 13a and 14a lose an inlet and outlet path for charges to and from the internal nodes N1 and N2, and the charges $Q_1$ and $Q_2$ accumulated in the auto zero period are held therein. Meanwhile, the coarse reference voltage $Va_i$ rather than the analog signal voltage Vin is applied to the input terminal of the first stage amplification circuit 13a of the coarse voltage comparator $A_i$ in this period. Thus, the voltages of the internal nodes N1 and N2 of the first stage and second stage amplification circuits 13a and 14a change its level from the threshold voltage Vb to certain voltages $V_1$ and $V_2$. Accordingly, the amount of charge Q at the internal node N1 of the first stage amplification circuit 13 is given by the following equation using the voltage $V_1$.

$$Q_1 = Cc(V_1 - Va_i) + C_{s1}V_1 \qquad (3)$$

Therefore, from equations (1) and (3), the voltage $V_1$ is finally given by the following equation.

$$V_1 = Vb + \lambda(Va_i - V_{in}) \qquad (4)$$

where,
$$\lambda = Cc/(Cc + Cs) \qquad (5)$$

Equation (4) means that the voltage of the internal node N1 of the first stage amplification circuit 13a shifts from the threshold voltage Vb in response to a voltage change (this proportion amount is referred to as a voltage transmission rate) generated at the input. More specifically, the amount of voltage change created on the input side by the coupling capacitor Cc and the parasitic capacitor Cs is multiplied by $\lambda$, and the $\lambda$-multiplied voltage change is superimposed to the threshold voltage Vb. Now, assuming that the voltage change on the input side is $\Delta V_{in}$, the voltage on the output side before this voltage change is transferred is Vout$_0$, the voltage on the output side after the transfer is Vout, Vout is generally given by the following equation $$Vout = Vout_0 + \lambda\Delta Vin \qquad (6)$$

Accordingly, the input of the first stage amplification circuit 13a is shifted from the threshold voltage Vb by $\lambda\Delta Vic$ (where $\Delta Vic = Va_i - Vin$; coarse input differential voltage). Such shift amount is amplified by the inversion amplifier 16 of the first stage amplification circuit 13a. When the voltage amplification factor of the inversion amplifier 16 is $-G$ and the output voltage is $V_3$, the output voltage $V_3$ is given by the following equation:

$$V_3 = Vb - \lambda G\Delta Vic \qquad (7)$$

In the second stage amplification circuit 14, the above-stated voltage $V_3$ is applied rather than the threshold voltage Vb in the auto zero period. The application of the output voltage $V_3$ changes the voltage of the internal node N2 from Vb. The amount of this voltage change can be produced based on the principle of conservation of charge in the input node N2, but herein, only the result is given based on equation (6). More specifically, the voltage change $\Delta V_3$ on the input side of the second stage amplification circuit 14 is $-\lambda G\Delta Vic$ from equation (7), and therefore the voltage change $\Delta V_2$ generated at the node N2 is given by the following equation:

$$\Delta V_2 = \lambda\Delta V_3 = -\lambda^2 G\Delta Vic \qquad (8)$$

This voltage change $\Delta V_2$ is further amplified by the inversion amplifier 16 of the second stage amplification circuit 14a. The voltage change $\Delta V_4$ in the output end of the inversion amplifier 16 is given by the following equation:

$$\Delta V_4 = -G\Delta V_2 = \lambda^2 G^2 \Delta Vic \qquad (9)$$

This is further amplified by the inversion amplifier 15a, and, therefore, the output voltage $V_5$ of the amplifier 15a is given by the following equation:

$$V_5 = Vb - G\Delta V_4 = Vb - \lambda^2 G^3 \Delta Vic \qquad (10)$$

Equation (10) indicates that the coarse input differential voltage $\Delta Vic$ is multiplied by $\lambda^2 G^3$ for output in the coarse voltage comparator $A_i$. Accordingly, if, for example, $\lambda = 1$, $G = 10$, $Vb = 2.5$ V, and an input differential voltage is equal to or larger than 1.7 mV, amplification can be made up to a logic level ("H" is more than 4.2 V, while "L" is less than 0.8 V with a power supply voltage of 5 V). At that time, the voltage comparator outputs an "H" level when $Vin > Va_i$, and an "L" level when $Vin < Va_i$. Based on this output result (comparison result) the reference voltage generation circuit 1 generates the fine reference voltage $Vb_j$, and applies the generated voltage to the fine reference voltage application terminal $b_j$.

The fine voltage comparator $B_j$ operates based on the same principle as the coarse voltage comparator $A_i$ with only the difference being that comparison is conducted when the clock signal $\phi 3$ is in an "H" level (this is called fine comparison period). Therefore, description will not be repeated here.

As described above, when the conventional 2-input voltage comparator is used in a subranging A/D converter, it is necessary to separately provide a voltage comparator for coarse A/D conversion and a voltage comparator for fine A/D conversion. As described above, the subranging A/D converter conducts series-parallel A/D conversion in two stages, and as is well known the converter needs at least $2^m - 1$ voltage comparators for a parallel A/D conversion of, for example, m bits. Accordingly, with increase of resolution, the number of voltage comparators necessary increases as an exponential rate. In order to alleviate such disadvantage of the subranging A/D converter, use of a 3-input voltage comparator is proposed in an article entitled "An 8-bit 20 MS/s CMOS A/D Converter with 50-mW Power Consumption" IEEE Journal of Solid State Circuit 1990 Vol. 25, No. 1 pp. 167-172.

FIG. 15 is a circuit diagram showing the 3-input voltage comparator disclosed in the above-stated article, and FIG. 16 is a representation showing the signal waveforms of the circuits in FIG. 15. The voltage comparator shown in FIG. 15 is different from the voltage comparator shown in FIG. 13 in that a three-input input circuit 19 is used instead of two 2-input input circuits 12 and 17, and first stage and second stage amplification circuits 13 and 14, and the inversion amplifier 15 are provided one for each. The input circuit 19 includes three input terminals, an analog signal application terminal, a coarse reference voltage application terminal $a_i$ and a fine reference voltage application terminal $b_j$. The input terminals 8, $a_i$ and $b_j$ are connected together to the input end of the first stage amplification circuit 13 respectively through switches S1, S2 and S4. The switch S1 is turned on/off in response to the clock signal $\phi 1$. The switch S2 is turned on/off in response to the clock signal $\phi 2$. The switch S4 is turned on/off in response to the clock signal $\phi 3$.

A description of an operation follows. The voltage comparator is controlled by the clock signals shown in FIG. 16 (the same as those shown in FIG. 14), and operates in three stages. When the clock signal $\phi 1$ is in an "H" level (auto zero period), the switches S1 and S3 are turned on, while the switches S2 and S4 are turned off. With the switch S1 being turned on, the analog signal voltage Vin is applied to the input of the first stage amplification circuit 13. With the switch S3 being turned on, the internal nodes N1, N2 and outputs of the first stage and second stage amplification circuits 13 and 14 are biased to the logic threshold voltage Vb of the inversion amplifier 16. The output of the inversion amplifier 15 is biased to the voltage Bb accordingly.

In a period when the clock signal $\phi 2$ is of "H" level (coarse comparison period), only the switch S2 is turned on, and the other switches S1, S3, and S4 are turned off. The operation in this case is the same as the above-stated voltage comparator (FIG. 13), a description will not be repeated here.

In a period when the clock signal $\phi 3$ is of "H" level (fine comparison period), the switch S4 is turned on, and the other switches S1-S3 are turned off. Also in this period, with the switch S3 still being turned off, the internal nodes N1 and N2 of the first stage and second stage amplification circuits 13 and 14 attain a high impedance state. Therefore, in the auto zero period, charges accumulated at the internal nodes N1 and N2 are still conserved in this period, and equation (6) given above holds in this period. Meanwhile, with the switch S4 being turned on, the fine reference voltage $Vb_j$ instead of the coarse reference voltage $Va_i$ is applied to the input of the first stage amplification circuit 13. The voltage obtained by multiplying this voltage change ($Vb_j - Va_i$) by $\lambda$ is superimposed to the voltage $V_1$ produced by equation (4). Accordingly, the voltage $V_{11}$ of the node N3 of the amplification circuit 13 in the fine comparison period is given by the following equation:

$$\begin{aligned} V_{11} &= V_1 + \lambda(Vb_j - Va_i) \\ &= Vb + \lambda(Va_i - V_{in}) + \lambda(Vb_j - Va_i) \\ &= Vb + \lambda(Vb_j - V_{in}) \end{aligned} \qquad (11)$$

Equation (11) indicates that voltage change from Vin to the fine reference voltage $Vb_j$ takes place at the input end of the first stage amplification circuit 13. The voltage shift from the logic threshold voltage Vb is transferred to succeeding stages as is the case with the voltage comparator shown in FIG. 13, and a fine comparison is conducted. When the voltage comparator is constructed as shown in FIG. 15, the coarse and fine voltage comparisons can be conducted in a single voltage comparator. Therefore, A/D conversion of a total of 2m bits formed of more significant m bits and less significant m bits is conducted, ($2^m - 1$) voltage comparators may be provided. This means that the number of voltage comparators necessary is reduced by half as compared to the 2-input voltage comparator (FIG. 13) which requires $2 \cdot (2^m - 1)$ voltage comparators. The voltage comparator of this construction however still suffers from the following disadvantage.

This disadvantage will be described in conjunction with the output transient responsive waveforms of the amplification stages of fine voltage comparator $B_j$ and the transient responsive waveforms of the amplification stages of the 3-input voltage comparator shown in FIG. 16. In FIGS. 14 and 16, V3 represents the output voltage of the first stage amplification circuit 13, V4 the output voltage of the second stage amplification circuit 14, and V5 the output voltage of the inversion amplifier 15. As can be seen from FIG. 14, all the internal nodes N1-N4 are biased to the threshold voltage Vb immediately before fine comparison in the 2-input voltage comparator (this state is referred to as initial state), the internal nodes N1-N4 start responding for outputting a correct comparison result the moment the fine reference voltage $Vb_j$ is supplied. In contrast, in the 3-input voltage comparator, the internal nodes have shifted from the logic threshold voltage Vb immediately before execution of the fine comparison depending upon the coarse comparison result. Accordingly, the 3-input voltage comparator requires an extra time period (this is referred to as recovery time) until the voltage at the end of the coarse comparison returns to the initial state. For example, in the first stage amplification circuit 13, time until the output voltage V3 crosses the logic threshold voltage Vb is the recovery time of the amplification circuit 13. The output voltage V4 of the second stage amplification circuit 14 begins to be inverted at the moment the output voltage of the first stage amplification circuit 13 crosses Vb. Therefore, the recovery time of the amplification circuit 14 is produced as the sum of the recovery time of the first stage amplification circuit 13 and its recovery time. Recovery time increases in succeeding stages, which results in degradation in the comparison speed for the entire voltage comparator.

Additionally, in the conventional 2-input and 3-input voltage comparators, comparison accuracy sometimes degrades due to a clock noise. A transmission gate as shown in FIG. 17 is generally used for the switches S1-S4 in the voltage comparators shown in FIGS. 13 and 15. The transmission gate includes a PMOS transistor 20, and an NMOS transistor 21 connected in parallel thereto. The PMOS and NMOS transistors 20 and 21 have their gate terminals 22 and 23 supplied with clock signals which are complementary to each other. The drain electrodes and source electrodes of the transistors 20 and 21 are connected together to terminals 24 and 25, respectively. Gate-drain capacitors 26 and 27 of capacitance values $C_1$ and $C_2$ exist in a parasitic manner between the gate electrodes 22, 23 and drain electrodes 24 of the transistors 20, 21. Similarly, gate-source capacitors 28 and 29 of capacitance values $C_3$ and $C_4$ exist in a parasitic manner between the gate electrodes and source electrodes of transistors 20 and 21.

Now, an operation of the transmission gate taking into account the parasitic capacitance will be described. When a signal applied to the gate electrode 22 changes its level from "L" to "H", and a signal applied to the gate electrode 23 changes its level from "H" to "L", the transmission gate is turned off. This gate voltage change is transferred to the terminals 24 and 25 through the parasitic capacitor. More specifically, charge is implanted into terminals 24 and 25 by the change of the gate voltage. When the terminals 24 and 25 are in the state of high impedance, a minor voltage change takes place by the implanted charge. When a signal of a large amplitude is dealt with as in the case of a digital circuit, such minor voltage change does not cause any problem, but results in a significant problem in an analog circuit.

Now, an operation of the 2-input coarse voltage comparator $A_i$ taking into such implanted charge will be described. Consider, for example, the switch S3 of the first stage amplification circuit 13a shown in FIG. 13. When the switch S3 is formed of a transmission gate, it generates a voltage change caused by the change of the clock signal at the internal node N2 at the moment it is turned off. The voltage change $\Delta V_{21}$ of the internal node N2 caused exclusively by this clock change is given by the following equation, wherein the gate terminal voltage of a P type transistor is $\Delta Vclk$, and the gate terminal voltage of an N type transistor is $-\Delta Vclk$:

$$\Delta V_{21} = \frac{C_1}{Cc + Cs_1} \Delta Vclk + \frac{C_2}{Cc + Cs_1}(-\Delta Vclk) \quad (12)$$

$$= \frac{C_1 - C_2}{Cc + Cs_1} \Delta Vclk$$

Therefore, the voltage $V_1$ of the internal node N1 in the first stage amplification circuit 13 in the coarse comparison period when such clock noise is taken into account is given by the following equations:

$$V_1 = Vb + \lambda \Delta Vic + \lambda C \Delta Vclk \quad (13)$$

, where
$$\lambda C \to (C_1 - C_2)/(Cc + Cs_1) \quad (14)$$

From the above equations, when, for example, $\Delta Vic = -1$ mV, and $\Delta Vclk = 5$ V, and the following expression holds:

$$C_1 - C_2 > Cc/5000 \quad (15)$$

This indicates that an erroneous operation is caused by the clock noise. When expression (15) is satisfied, $V_1 - Vb > 0$ is true despite that $\Delta Vic < 0$. In order to prevent such erroneous operation, if $Cc = 0.1$ fF, the expression $C_1 - C_2 < 0.02$ fF or smaller must be satisfied. $C_1$ and $C_2$ are parasitic capacitors, and, therefore, it is difficult to control the capacitance values in the above-stated order. Upon occurrence of an erroneous operation in the first stage amplification circuit 13, this error is amplified and output as a comparison result. Such clock noise is also generated in the second stage amplification circuit 14, but the signal has already been amplified at the first stage amplification circuit 13, and therefore does not cause such a significant problem as compared to the first stage.

With the conventional 2-input voltage comparator constructed as in the above-described manner, the number of voltage comparators necessary when an A/D converter is formed using such voltage comparators increases as an exponential function with increase of the resolution of A/D converter. Also, the conventional 3-input voltage comparator alleviates the above-stated problem, but its comparison speed decreases. Furthermore, both 2-input and 3-input voltage comparators are prone to erroneous operations caused by clock noises, and both have problems in the comparison accuracies.

SUMMARY OF THE INVENTION

It is an object of the present invention to simplify a construction of a subranging A/D converter.

Another object of the invention is to provide a high speed and highly accurate voltage comparator.

Simply stated, a voltage comparator in accordance with the invention is a voltage comparator to compare an analog input signal and at least 2 reference voltages, and includes at least two voltage signal generators, an amplifier, and a resetting device.

The at least two voltage signal generators are provided correspondingly to at least two reference voltages, each of which generates in a time-dividing manner a voltage signal corresponding to the difference between the analog input signal and a corresponding reference voltage.

The amplifier sequentially amplifies the reference voltage generated in a time dividing manner by the at least two voltage signal generators after a prescribed resetting period.

The resetting device resets the offset voltage of the amplifier in the prescribed resetting period.

In operation, the at least two voltage signal generators generate in a time dividing manner voltage signals corresponding to the difference between the analog input signal and a corresponding reference voltage. The generated respective voltage signals are sequentially applied to the amplifier. The amplifier is reset by the resetting device before amplifying the voltage signals. Thus, the offset voltage accumulated in amplifying the voltage signal is canceled, and the voltage signal applied thereafter is amplified. It is therefore not necessary to set recovery time for the amplifier, which reduces time required for the comparison. A clock noise from the resetting period to the next comparison period is canceled between the outputs of at least two voltage signal generators, thus suppressing erroneous operations caused by the clock noise.

According to the invention, since comparison between an analog input signal and at least two reference voltages is conducted in a single voltage comparator, the number of voltage comparators necessary can be reduced as compared to a conventional 2-input voltage comparator. Thus, the construction of a subranging A/D converter can be simplified. The amplifier is reset before amplifying each of the voltage signals output from at least two voltage signal generators, recovery time will not be necessary, and the clock noise can be canceled. As a result, a high speed and highly accurate voltage comparator can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
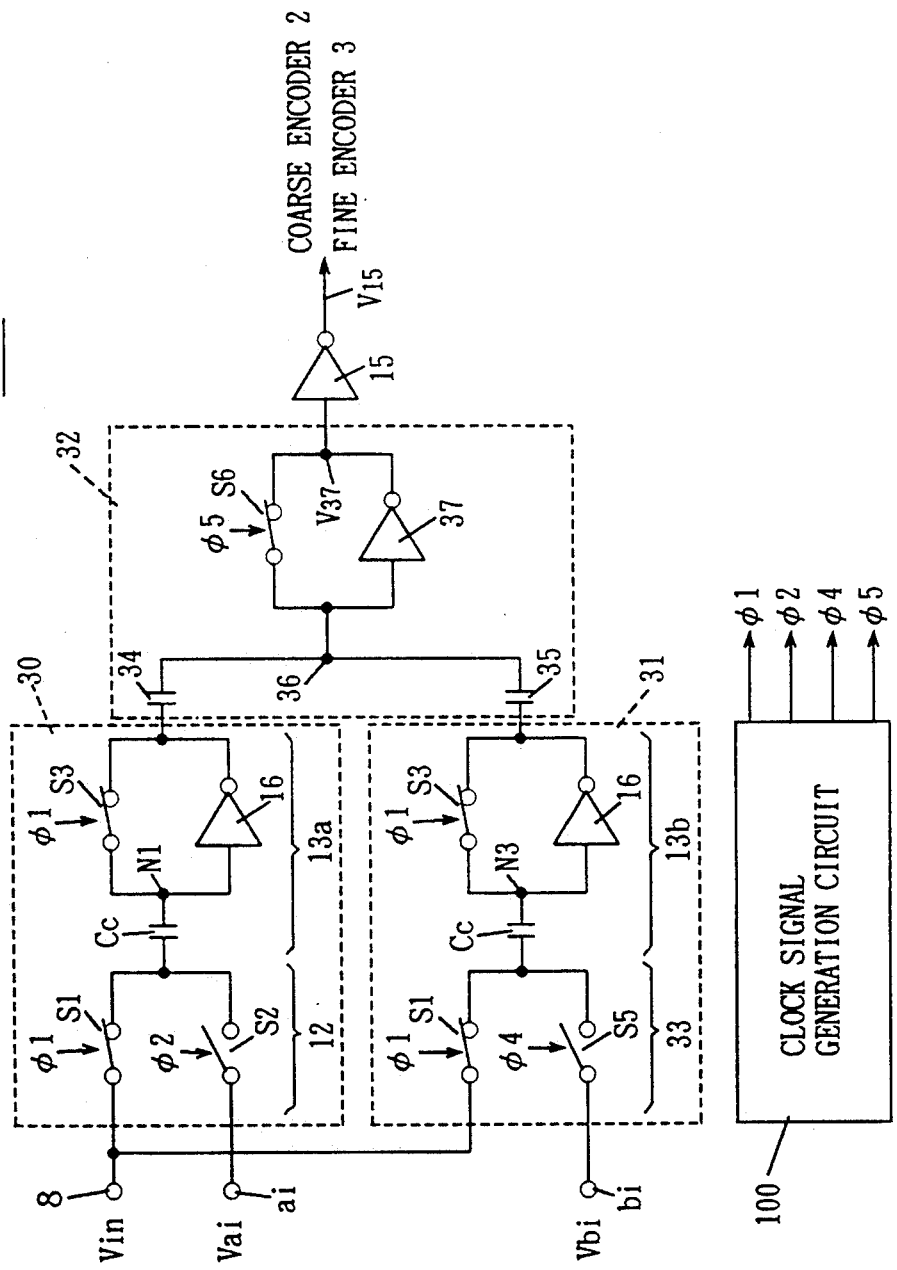
FIG. 1 is a circuit diagram showing a voltage comparator in accordance with one embodiment of the present invention.

FIG. 1 is a circuit diagram showing an embodiment of a voltage comparator according to the invention. Referring to FIG. 1, the voltage comparator includes a coarse preceding comparison circuit 30, a fine preceding comparison circuit 31, a 2-input amplification circuit having an automatic zero compensation function 32, and an inversion amplifier 15. The voltage comparator is controlled by clock signals $\phi 1$, $\phi 2$, $\phi 4$ and $\phi 5$ generated by an externally provided clock signal generation circuit 100.

Figure 13:
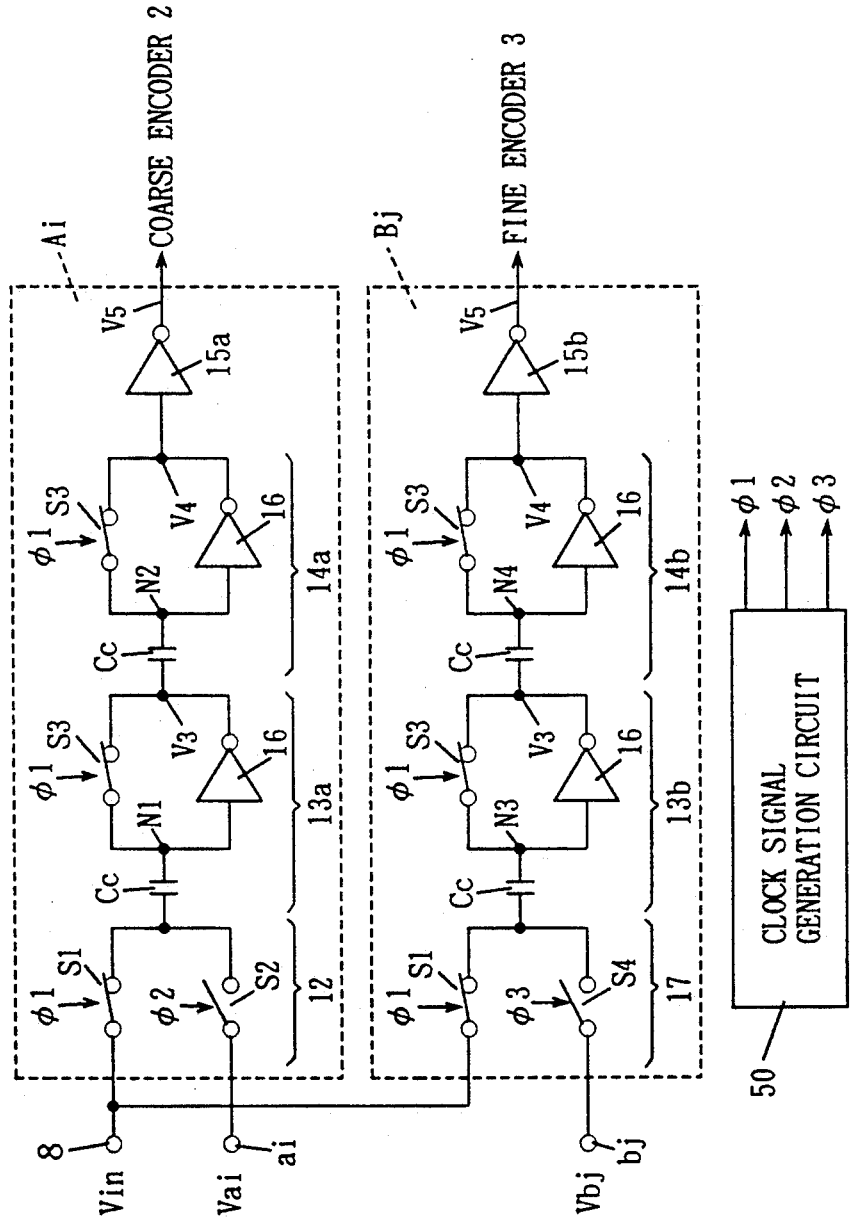
FIG. 13 is a circuit diagram showing a conventional 2-input voltage comparator.
Figure 14:
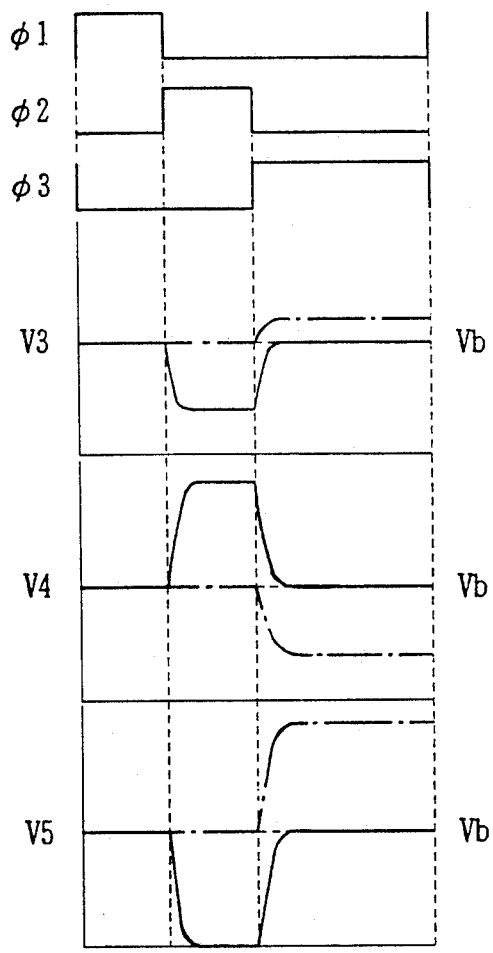
FIG. 14 is a representation showing the output waveforms of the circuits of the 2-input voltage comparator shown in FIG. 13.
Figure 15:
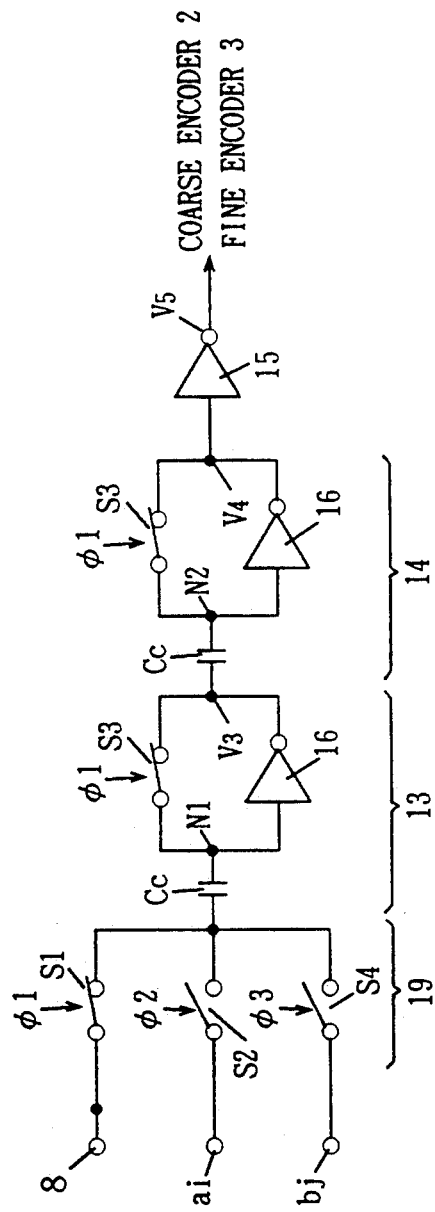
FIG. 15 is a circuit diagram showing a conventional 3-input voltage comparator.
Figure 16:
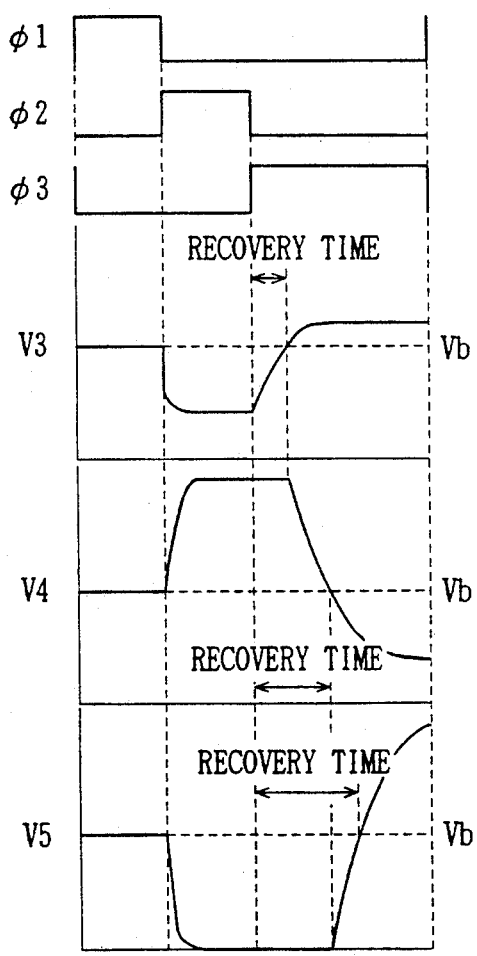
FIG. 16 is a representation showing the output waveforms of the circuits of the voltage comparator shown in FIG. 14.
Figure 17:
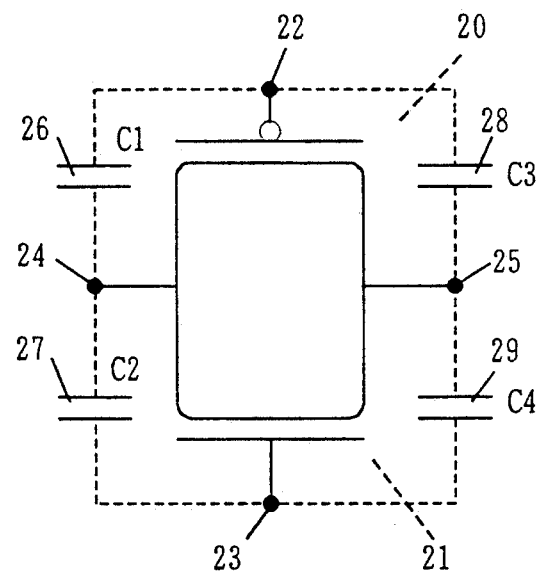
FIG. 17 is a circuit diagram showing examples of the switches S1–S4 shown in FIGS. 13 and 15.

The 2-input amplification circuit 32 has 2 input ends, one of which is connected to the output of the coarse preceding comparison circuit 30, and the other input end is connected to the output of the fine preceding comparison circuit 31. The inversion amplifier 15 is connected to the output of the 2-input amplification circuit 32. The coarse preceding comparison circuit 30 is formed of a series connection of an input circuit 12 and an amplification circuit having an automatic zero compensation function 13. The fine preceding comparison circuit 31 is formed of a series connection of an input circuit 33 and an amplification circuit having an automatic zero compensation function 13b. The constructions of the input circuit 12 and amplification circuit 13 are identical to those in FIG. 13, and a description will not be repeated here. In the input circuit 33, the switch S4 of the input circuit 17 shown in FIG. 13 is replaced with a switch S5 controlled by the clock signal $\phi 4$. The 2-input amplification circuit 32 includes capacitors 34 and 35, a switch S6, and an inversion amplifier 37. The capacitor 34 has a capacitance value $C_{34}$ and one end connected to the output of the coarse comparator 30, while the capacitor 35 has a capacitance value $C_{35}$ and one end connected to the output of the fine preceding comparison circuit 41, with the other ends of the capacitors 34 and 35 being connected together to an internal node 34. The internal node 36 is connected to the input of an inversion amplifier 37. The output of the inversion amplifier 37 is connected to the input of the inversion amplifier 15 and fed back to the input through the switch S6. The switch S6 is turned on/off in response to the clock signal $\phi 5$.

Figure 2:
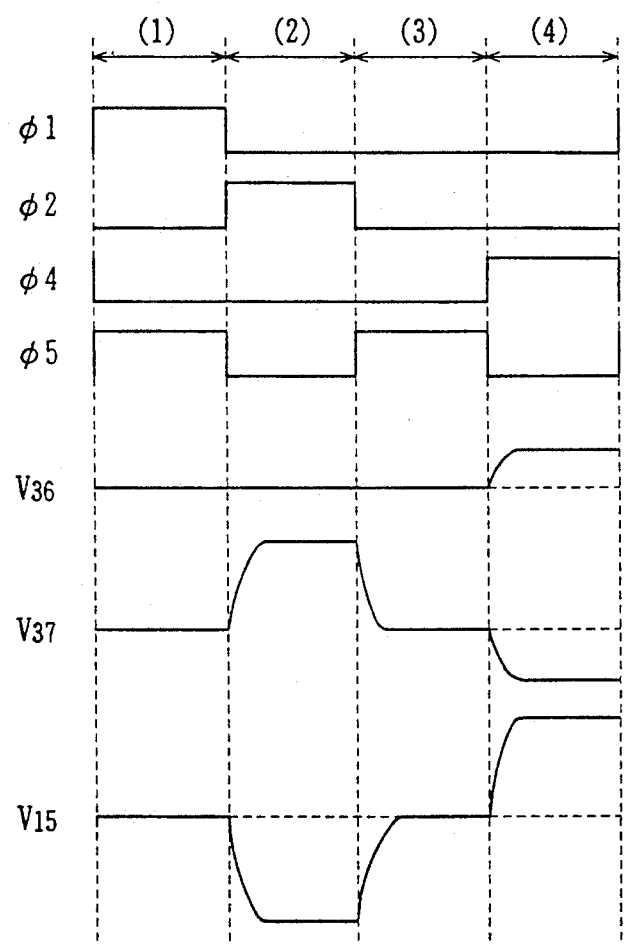
FIG. 2 is a representation showing the output signal waveforms of the circuits shown in FIG. 1.

FIG. 2 is a representation showing the output waveforms of the circuits shown in FIG. 1. Referring to the output waveforms shown in FIG. 2, a description of an operation of this embodiment follows. This voltage comparator operates in four stages altogether, i.e. auto zero period (1), coarse comparison period (2), reset (3), and fine comparison period (4). In the auto zero period (1), the clock signals $\phi 1$ and $\phi 5$ attain an H level, and the clock signals $\phi 2$ and $\phi 4$ attain an L level, which turns on the switches S1, S3, and S6, and turns off the switches S2 and S5. With the switch S1 being turned on, an analog signal voltage Vin is applied to the inputs of the preceding comparison circuits 30 and 31 and the amplification circuits 13a and 13b. Further, with the switches S3 and S6 being turned on, the input/output ends of the inversion amplifiers 15, 16, and 37 are biased to the threshold voltage Vb.

In the coarse comparison period (2), only the clock signal $\phi 2$ attains an "H" level, only the switch S2 is turned on, and all the other switches S1, S3, S5, and S6 are turned off. With the switches S3 and S6 being turned off, the internal nodes N1 and N3 of the amplification circuits 13a and 13b, and the internal node 36 of the amplification circuit 32 attain a high impedance state, and the charge stored in the auto zero period is conserved. Meanwhile, a coarse reference voltage $Va_i$ is applied to the input end of the amplification circuit 13a instead of the analog input voltage Vin. On the other hand, no voltage is applied to the amplification circuit 13b of the fine preceding comparison circuit 31. Therefore, the output of the fine preceding comparison circuit 31 does not undergo any voltage change except for those caused by clock noises, and the coarse comparison is conducted based on the same principle as the conventional one by series-connected amplification circuit 13 and 32, and inversion amplifier 15.

In the reset period (3), since only the clock signal $\phi 5$ attains an H level, only the switch S6 is turned on, and all the other switches S1, S2, S3, and S5 are turned off. With the switch S6 being turned on, the input of the inversion amplifier 15, and the input end of the inversion amplifier 37 are once again biased to the threshold voltage Vb. On the other hand, in this period and the fine comparison period following this period, the output voltage of the coarse preceding comparison circuit 30 does not change. Therefore, in the period until the fine comparison is completed, only a flow of a signal in a circuit formed of the fine preceding comparison circuit 31, the 2-input amplification circuit 32, and the inversion amplifier 15 is considered. Now, the voltage of the internal node N3 of the fine preceding comparison circuit 31 in the reset period (3) is considered. Voltage at the input/output end of the inversion amplifier 16 should usually be the threshold voltage Vb in this period (3), but the voltage change $\Delta Vclk$ caused by the clock noise exists as described in conjunction with the conventional example, an input voltage $V_1$ and an output voltage $V_3$ are given by the following equations, wherein the amplification factor of the inversion amplifier 16 is $-G$:

$$V_1 = Vb + \lambda c \Delta Vclk \qquad (16)$$

$$V_3 = Vb - \lambda cG \Delta Vclk \qquad (17)$$

In the fine comparison period (4), since only the clock signal $\phi 4$ attains an "H" level, only the switch S5 is turned on, while all the other switches S1, S2, S3, and S6 are turned off. With the switch S6 being turned off, the input/output end of the inversion amplifier 37 attains a high impedance state, and the charge stored at the internal node 36 in the reset period is conserved. Meanwhile, with the switch S5 being turned on, the fine reference voltage $Vb_j$ rather than the analog signal voltage Vin is applied to the amplification circuit 13b of the fine preceding comparison circuit 31. This voltage change $\Delta Vif = Vb_j - Vin$ is transferred to the node N3 of the fine preceding comparison circuit 31, and amplified by the inversion amplifier 16. The input voltage $V_{11}$ and output voltage $V_{13}$ of the inversion amplifier 16 at the time are given by the following equations:

$$V_{11} = Vb + \lambda c \Delta Vclk + \lambda \Delta Vif \qquad (18)$$

$$V_{13} = Vb - \lambda cG \Delta Vclk - \lambda G \Delta Vif \qquad (19)$$

Meanwhile the 2-input, amplification circuit 32 is reset in the reset period, and, therefore, only the voltage change since the reset period (3) to the fine comparison period (4) is transferred to the node 36 through the capacitors 34 and 35. Since there is not any voltage change at the input end of the capacitor 34, only the voltage change transferred through the capacitor 35 is superimposed to the threshold voltage Vb at the internal node 36. The voltage change $\Delta V$ from the reset period (3) to the fine comparison period (4) is given by the following equations (17) and (19):

$$\Delta V = V_{13} - V_3 = -\lambda G \Delta Vif \qquad (20)$$

Therefore, the voltage $V_{36}$ of the node 36 is given as:

$$V_{36} = Vb - \lambda G \Delta Vif \qquad (21)$$

As can be clearly seen from equation (21), the voltage of the internal node 36 is shifted from Vb by the amount of the voltage in proportion to the fine input differential voltage Vif, and free of any effect by a clock noise. This amount of shift from the threshold voltage Vb is amplified by the inversion amplifiers 37 and 15, and a comparison result in size between Vif and $Vb_j$ is output without an erroneous operation caused by the noise.

A voltage comparator constructed in the above-described manner reduces the number of voltage comparators required for forming an A/D converter by about ½ as compared to a conventional 2-input voltage comparator. Also, since coarse and fine comparisons are initiated from their initial states, recovery time is not necessary unlike a conventional 3-input voltage comparator. Comparison accuracy can also be improved with a clock noise canceling function. Although the above-stated noise canceling function is not effective in the coarse comparison, there will be no problem as far as the fine comparison is accurately conducted, because a coarse A/D conversion result is usually corrected based on a fine A/D conversion result in an A/D converter.

Figure 3:
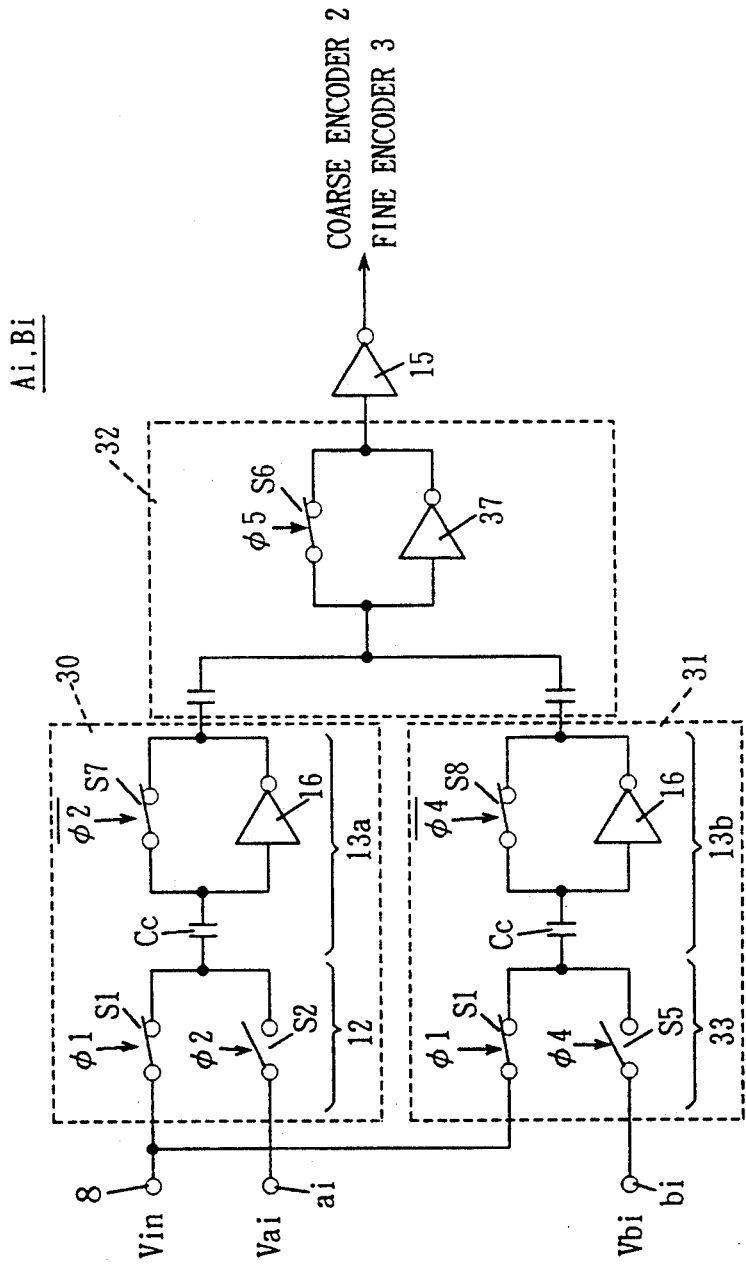
FIG. 3 is a circuit diagram showing a second embodiment of the invention.

FIG. 3 is a circuit diagram showing a second embodiment of the invention. The voltage comparator shown in FIG. 3 is different from the voltage comparator shown in FIG. 1 in that a switch S7 controlled by a clock signal $/\phi 2$ is provided instead of the switch S3 of the coarse preceding comparison circuit 30, and a switch S8 controlled by a clock signal $/\phi 4$ is provided instead of the switch S3 of the fine preceding comparison circuit 31.

In operation, the switch S7 is turned off only in a coarse comparison period (2), while the switch S8 is turned off only in a fine comparison period. Thus, coarse comparison and fine comparison can be conducted in the same manner as the voltage comparator shown in FIG. 1 in terms of timings, and recovery time is not necessary as is the case with the 3-input voltage comparator. However, in a reset period (3), since both switches are turned on, a clock noise generated in a transition period from the reset period to the fine comparison period cannot be canceled.

Figure 4:
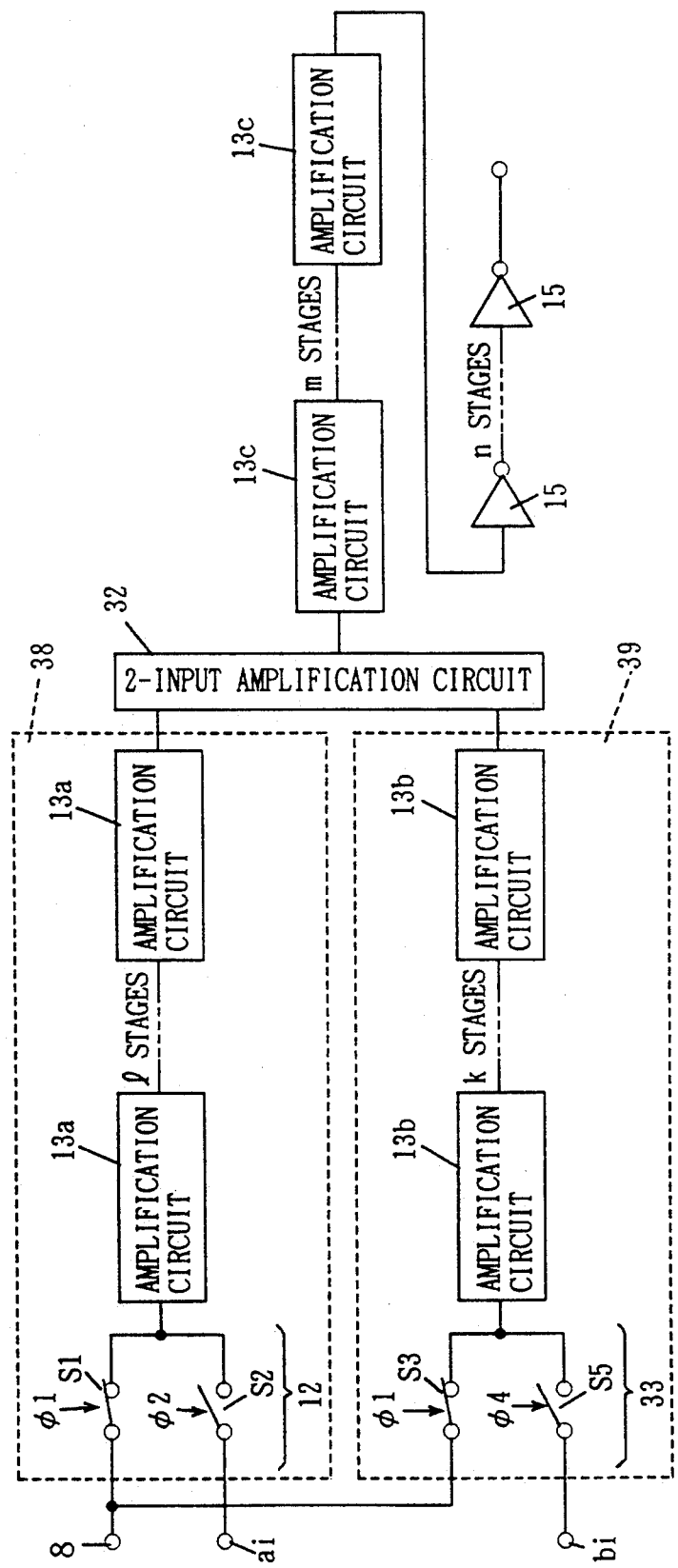
FIG. 4 is a circuit diagram showing a third embodiment of the invention.

In the above embodiment, the circuit configuration is simplified for the purpose of simplifying the description. A general embodiment of the invention is illustrated in FIG. 4. In a voltage comparator shown in FIG. 4, as is the case with FIG. 1, the outputs of a coarse preceding comparison circuit 38 and a fine preceding comparison circuit 39 are connected to the input of a 2-input amplification circuit 32. The output of the 2-input amplification circuit 32 is connected to the inputs of amplification circuits 13c of series-connected m stages having a function of automatic zero compensation. The final output of the amplification circuits 13c of the series-connected m stages is connected to the input of inversion amplifiers 15 of series-connected n stages ($n \geq 0$). The coarse preceding comparison circuit 38 includes an input circuit 12, amplification circuits 13a of series-connected l stages ($l \geq 1$). The fine preceding comparison circuit 39 includes an input circuit 33 and amplification circuits 13b of series-connected k stages ($k \geq 1$). Thus, by connecting the amplification circuits 13a, 13b, 13c and the inversion circuits of a plurality of stages in series, a comparison result can be brought about to an appropriate potential. The above-stated m, n, l, and k are different from the bit numbers shown in FIG. 11.

Figure 5:
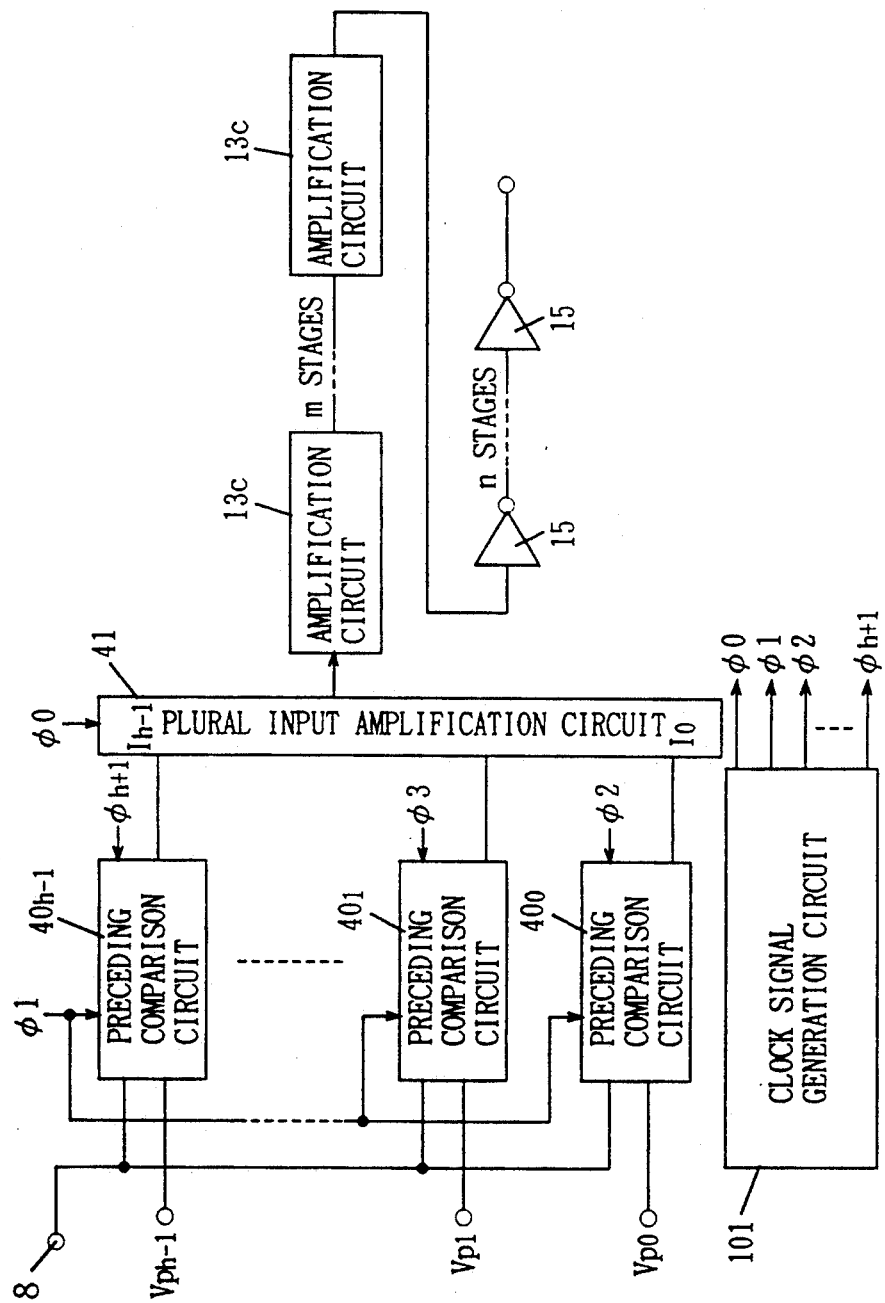
FIG. 5 is a circuit diagram showing a fourth embodiment of the invention.

FIG. 5 is a circuit diagram showing a fourth embodiment of the invention. A voltage comparator shown in FIG. 5 is different from the voltage comparator shown in FIG. 4 in that h ($h > 2$) preceding comparators $40_0$–$40_{h-1}$ are provided instead of two preceding comparators, an amplification circuit 41 having an automatic zero compensation function of h input nodes is provided instead of the 2-input amplification circuit. The voltage comparator shown in FIG. 5 allows an analog voltage Vin to be sequentially compared to reference voltages of different h levels ($h \geq 2$). A clock signal generation circuit 101 generates clock signals $\phi_0$–$\phi_{n+1}$ for controlling the voltage comparator.

Figure 6:
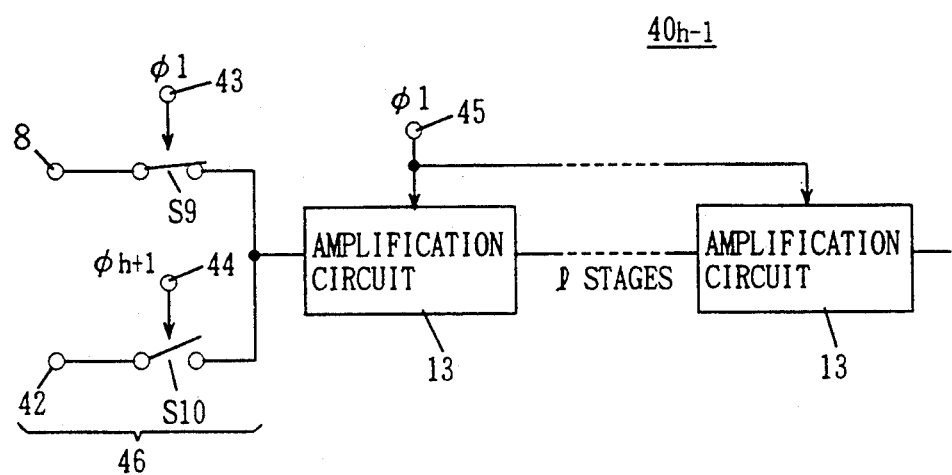
FIG. 6 is a circuit diagram showing a preceding comparison circuit 40 shown in FIG. 5.
Figure 7:
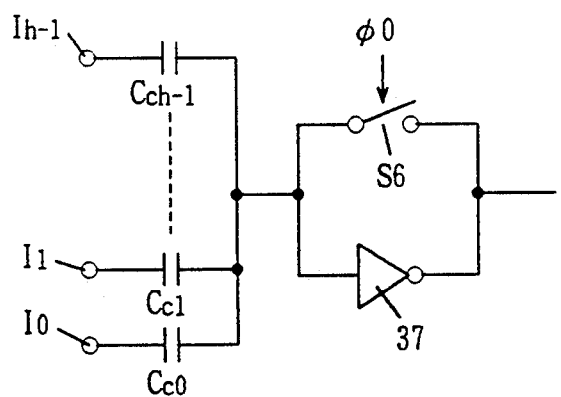
FIG. 7 is a circuit diagram showing in detail an amplifier having a plural-input automatic zero compensation function shown in FIG. 5.

FIG. 6 is a block diagram showing the preceding comparison circuit $40_{h-1}$ shown in FIG. 5. FIG. 7 is a block diagram showing a plural-input amplification circuit 41 having an automatic zero compensation function shown in FIG. 5. Referring to FIG. 6, the preceding comparison circuit $40_{h-1}$ includes an input circuit 46 and an amplification circuit 13 of l stages. This preceding comparison circuit $40_{h-1}$ further includes an analog voltage application terminal 8, a reference voltage application terminal 42, a terminal 43 for inputting the clock signal $\phi_1$ for analog signal, a terminal 44 for inputting the clock signal $\phi_p$ for reference voltage, and a terminal 45 for inputting the clock signal $\phi_1$. The input circuit 46 includes a switch S9 connected to the analog voltage application terminal 8 and turned on/off in response to the input clock signal $\phi_1$, and a switch S10 connected to the reference voltage application terminal 42 and turned on/off in response to the clock signal $\phi_p$ input to the terminal 43. The switch S3 of the amplification circuit 13 (FIG. 1) is controlled by the clock signal $\phi_1$ input to the terminal 45.

Referring to FIG. 7, the plural-input amplification circuit 41 includes h input terminals $I_0$–$I_{h-1}$, each of which is connected in common to the inversion amplifier 37 through a capacitor $Cc_p$ ($p=0-h-1$). The output end of the inversion amplifier 37 is connected to its input end through the switch S6 controlled by the clock signal $\Delta 0$ for resetting.

Referring back to FIG. 5, the analog signal application terminal 8 is supplied with an analog voltage Vin, while the reference voltage application terminal 42 is supplied with reference voltages Vp ($p=0-h-1$) of different h levels. The clock signals $\phi_1$ and $\phi_p$ ($p=2-h+1$) are applied to the clock signal application terminals 43 and 44, respectively. The clock signal $\phi_1$ is applied to the terminal 45 (FIG. 6).

Figure 8:
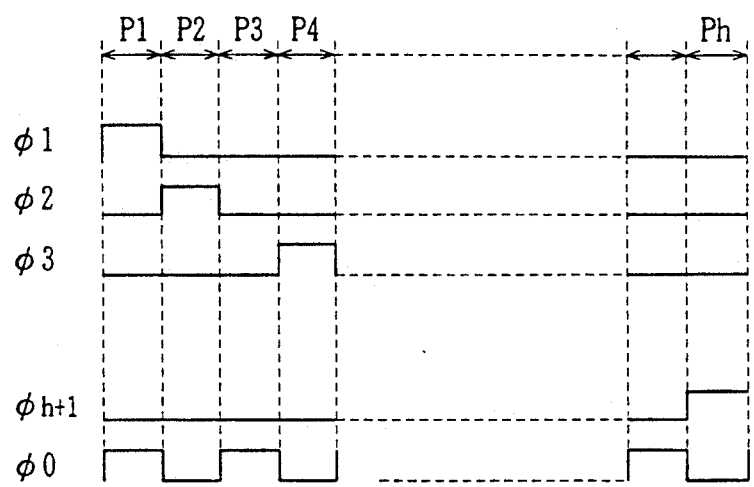
FIG. 8 is a timing chart for use in illustration of an operation of the voltage comparator shown in FIG. 5.

FIG. 8 is a timing chart showing an operation of the voltage comparator shown in FIGS. 5 to 7. The operation of the voltage comparator will be described in conjunction with FIG. 8. The voltage comparator operates in 2h stages. In a first period $p_1$ (a period when the clock signal $\phi_1$ is in "H" level), the preceding comparison circuit 40 inputs the analog signal voltage Vin and is set to auto zero (automatically set to $V_b$ level). At that time, the plural-input amplification circuit 41 and the amplification circuits 13c of m stages connected in series to this amplification circuit 41 are set to auto zero. In a second period $p_2$ (a period when the clock signal $\phi_2$ is in "H" level), the preceding comparison circuit 40 for inputting a first reference voltage $V_{p0}$ attains a comparison mode, and applies the reference voltage $V_{p0}$. At that time, all the above-stated amplification circuits 41 and 13 attain the comparison mode, and a voltage comparison between the analog input voltage Vin and the reference voltage $V_{p0}$ is conducted. In a third period $p_3$, the plural-input amplification circuit 41 and the amplification circuits 13 of m stages connected in series thereto are once again set to auto zero, and the above-stated first comparison result is reset. Then, when the clock signal $\phi_3$ is in "H" level, in other words in a fourth period $p_4$, the preceding comparison circuit 40 for inputting a second reference voltage $V_{p1}$ attains a comparison mode, and inputs the reference voltage $V_{p1}$. At that time, the above-stated amplification circuits 41 and 13 again attain the comparison mode, and a voltage comparison between the analog input voltage Vin and the reference voltage $V_{p1}$ is conducted. Thereafter, similarly repeating the voltage comparison, the reference voltages $V_{p0}$–$V_{ph-1}$ in the H level are subjected to comparison in time series.

Figure 9:
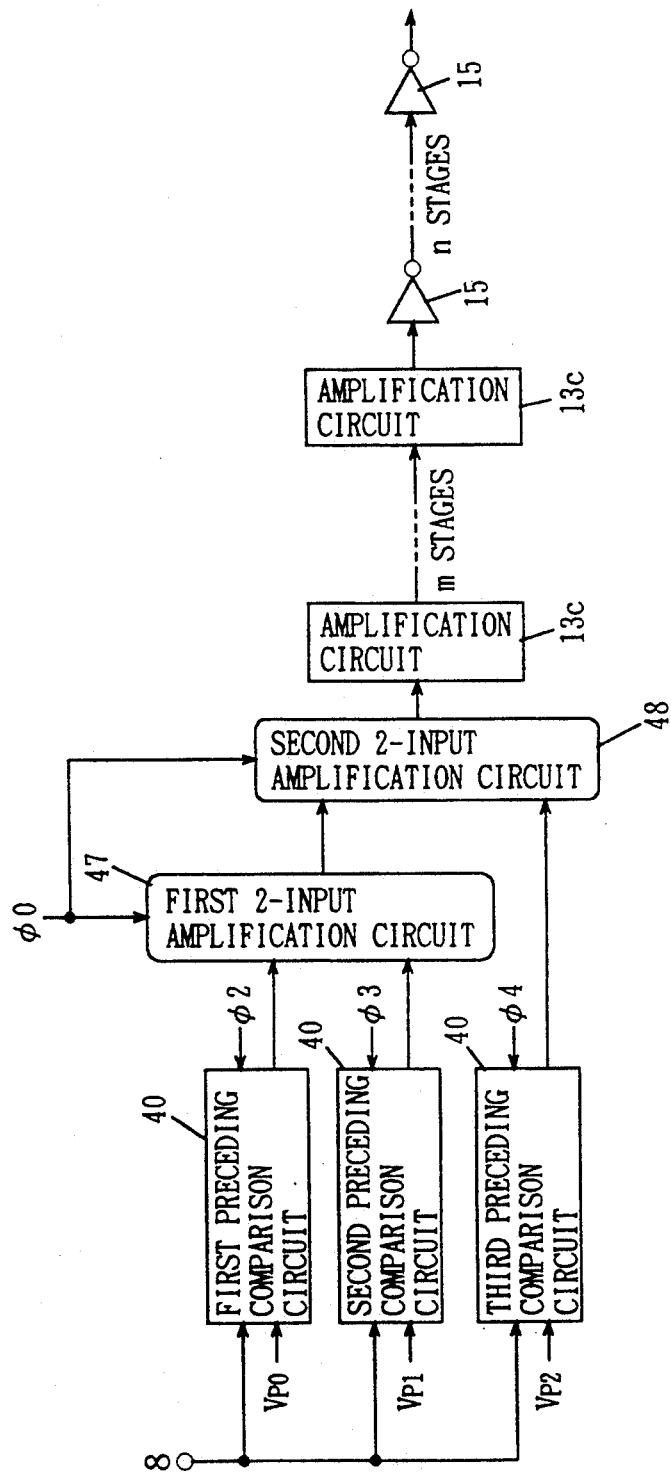
FIG. 9 is a circuit diagram showing a fifth embodiment of the invention.

FIG. 9 is a circuit diagram showing a fifth embodiment of the invention. A voltage comparator in FIG. 9 is different from the voltage comparator shown in FIG. 5 in that 2 or more plural-input amplification circuits are used. Referring to FIG. 9, the voltage comparator includes first, second, and third preceding comparison circuits 400, 401, and 403 provided correspondingly to reference voltages $V_{p0}$–$V_{p2}$ of three levels, a first 2-input amplification circuit 47 connected to the outputs of the first and second preceding comparison circuits 400 and 401, a second 2-input amplification circuit 48 connected to the amplification circuit 47 and the third preceding comparison circuit 402, amplification circuits 13 of m stages ($m \geq 0$) connected in series to the amplification circuit 48, and inversion amplifiers 15 of n stages ($n \geq 0$) connected in series to the amplification circuits 13.

Now, an operation of the fifth embodiment will be described. The voltage comparator operates in six stages. In the first stage, the first to third preceding comparison circuits 400 and 401, the first and second 2-input amplification circuits 47 and 48, and the amplification circuit 18 are all set to auto zero (automatically set to $V_b$ level). At that time, the first preceding comparison circuit 400 inputs an analog signal voltage Vin. In the second stage, the first preceding comparison circuit 400 attains a comparison mode, and inputs the reference voltage $V_{p0}$. At that time, the amplification circuits 47, 48, and 13 all attain the comparison mode, and a voltage comparison between Vin and $V_{p0}$ is conducted. In the third stage, the amplification circuits 47, 48, and 13 are once again set to auto zero, thus resetting the first comparison result. In the fourth stage, the second preceding comparison circuit 401 for inputting the second reference voltage $V_{p1}$ attains a comparison mode, and inputs the reference voltage $V_{p1}$. At that time, the amplification circuits 47, 48, and 13 once again attain the comparison mode, and a voltage comparison between Vin and $V_{p1}$ is conducted. In the fifth stage, the amplification circuits 48 and 13 are once again set to auto zero, thus resetting the second comparison result. In the sixth stage, the third preceding comparison circuit 402 for inputting the third reference voltage $V_{p2}$ attains a comparison mode, and inputs the reference voltage $V_{p2}$. At that time, the amplification circuits 48 and 13 also once again attain the comparison mode, and a voltage comparison between Vin and $V_{p2}$ is conducted. Thus, comparison between the analog signal voltage and the reference voltages of three levels can be conducted.

Although in the first to fifth embodiments, the bias voltages (threshold voltages) for the amplification circuits having an automatic zero compensation function or the plural-input amplification circuit are set by switches for feed back, but the invention is by no means limited thereto. For example, such biasing can be implemented by a circuit as shown in FIG. 10.

Figure 10:
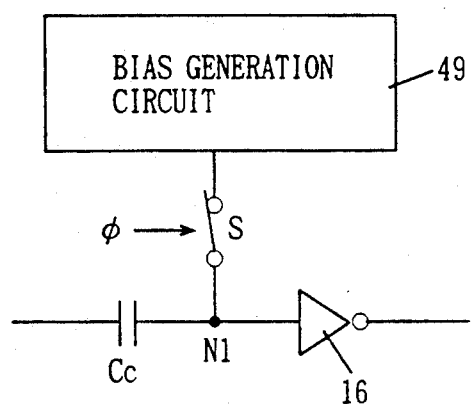
FIG. 10 is a circuit diagram showing a variation of an amplification circuit having an automatic zero compensation function.

Referring to FIG. 10, the amplification circuit having an automatic zero compensation function is connected to the inversion amplifier 16 through a 3-input coupling capacitor Cc. The input of the inversion amplifier 16 is also connected to the output of the bias generation circuit 49 through the switch controlled by the clock signal $\phi$. The bias generation circuit 49 generates a voltage signal in an approximately identical level to a logic threshold voltage Vb.

In operation, the inversion amplifier 16 is reset by a bias voltage generated by the bias generation circuit 49.

Figure 11:
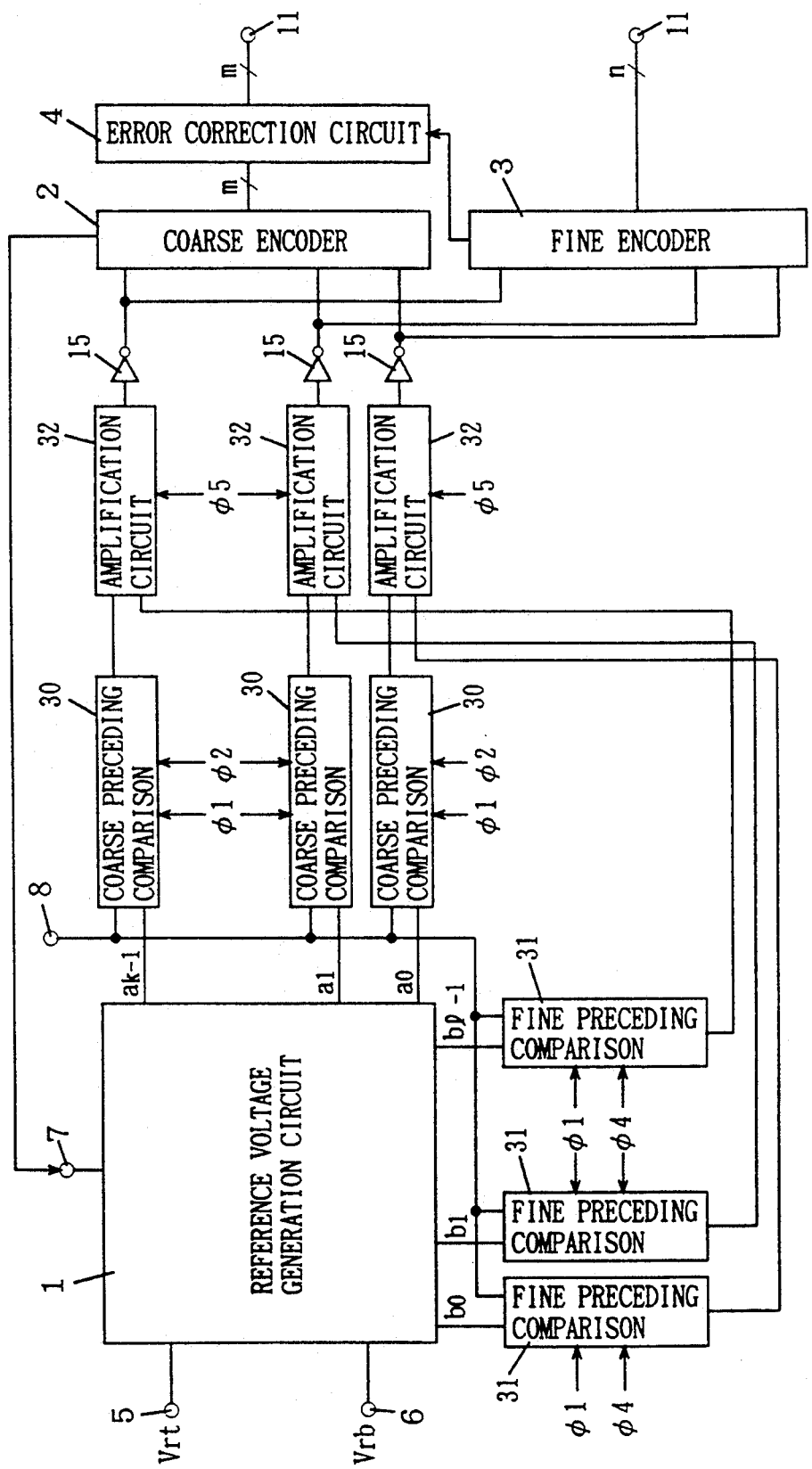
FIG. 11 is a block diagram showing an A/D converter in accordance with a sixth embodiment of the invention.
Figure 12:
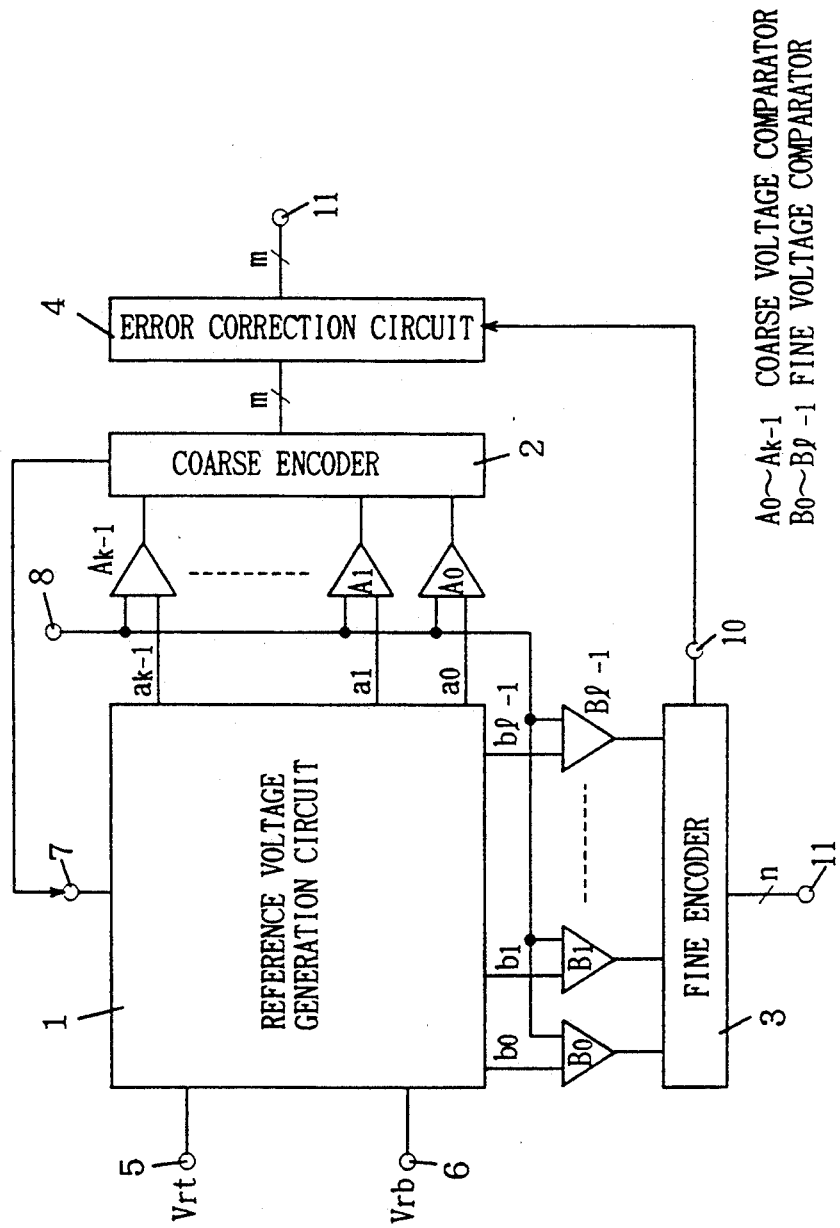
FIG. 12 is a block diagram showing a conventional subranging A/D converter.

FIG. 11 is a block diagram showing a subranging A/D converter in accordance with a sixth embodiment of the invention. The A/D converter shown in FIG. 11 is different from the A/D converter shown in FIG. 12 in that a voltage comparator including a coarse preceding comparator 30, a fine preceding comparator 31, an amplification circuit 32, and an inverter 15 shown in FIG. 11 is provided instead of the voltage comparator shown in FIG. 13. The other circuit elements are the same as those shown in FIG. 12. In FIG. 11, for the purpose of simple representation, the coarse and fine preceding comparators 30 and 31 of the same number are shown.

Operations of the circuits 30, 31, 32, and 15 are the same as those already described in conjunction with FIG. 1.

As shown in FIG. 11, since the amplification circuit 32 and the inverter 15 for resetting and amplifying a coarse comparison result and a fine comparison result can be shared between the coarse part and the fine part, this subranging A/D converter can be implemented with a reduced number of elements as compared to conventional ones.

The voltage comparator used in this A/D converter, as described above, can operate at a high speed with high accuracy, and, therefore, high speed and highly accurate A/D conversion operation can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage comparator for comparing a potential of an analog input signal to potentials of reference voltages of coarse and fine stages, comprising:

coarse comparison means for comparing said potential of analog input signal and the coarse reference voltage;

fine comparison means for comparing said analog input voltage and the fine reference voltages;

outputting means for outputting a comparison result of said coarse comparison means and a comparison result of said fine comparison means in a time dividing manner such that said comparison results of said coarse and fine comparison means are outputted during different periods of time;

amplification means, commonly coupled to said outputting means to receive both of said comparison results of said coarse and fine comparison means, for amplifying said comparison results output in the time dividing manner; and resetting means for resetting the offset voltage of said amplification means before outputting said comparison results to said amplification means.

2. A voltage comparator for comparing a potential of an analog input signal to potentials of at least two reference voltages, comprising:

at least first and second voltage signal generation means provided correspondingly to said at least two reference voltages, each for generating a voltage signal corresponding to the difference between the potential of the analog input signal and a corresponding reference voltage;

amplification means having an input node commonly connected to the outputs of said first and second voltage signal generation means, for sequentially amplifying said voltage signals generated in a time dividing manner such that voltage signals of said at least first and second voltage signal generation means amplified by said amplification means are outputted during different periods of time; and resetting means for resetting the offset voltages of said first and second voltage signal generation means and said amplification means.

3. A voltage comparator as recited in claim 2, wherein said at least two reference voltages include a coarse reference voltage for generating more significant bits in a subranging A/D converter and a fine reference voltage for generating less significant bits; and said resetting means includes a clock signal generation means for generating a first clock signal for resetting the offset voltages of said first and second voltage signal generation means, a second clock signal for comparing the potential of said analog input signal and said coarse reference voltage, a third clock signal for resetting the offset voltage of said amplification means, and a fourth clock signal for comparing the potential of said analog input signal and said fine reference voltage.

4. A voltage comparator as recited in claim 3, wherein said first voltage signal generation means includes, first input means for inputting said analog input signal and said coarse reference voltage in a time dividing manner;

second input means for inputting said analog input signal and said fine reference voltage in a time dividing manner;

first amplification means coupled to said first input means for amplifying the difference between the potential of the analog input signal and said coarse reference voltage input by said first input means; and second amplification means coupled to said second input means for amplifying the difference between the potential of the analog input signal and said fine reference voltage input by said second input means.

5. A voltage comparator as recited in claim 4, wherein said first amplification means is provided in a plurality and coupled in series between said first input means and the input of said amplification means, and said second amplification means is provided in a plurality and coupled in series between said second input means and the input of said amplification means.

6. A voltage comparator as recited in claim 4, wherein said first input means includes:

first switching means connected between a terminal for inputting said analog input signal and said first amplification means and turned on only in response to the first clock signal generated by said clock signal generation means; and second switching means connected between a terminal for inputting said coarse reference voltage and said first amplification means and turned on only in response to the second clock signal generated by said clock signal generation means, and said second input means includes:

third switching means connected between the terminal for inputting said analog input signal and said second amplification means and turned on only in response to the first clock signal generated by said clock signal generation means; and fourth switching means connected between a terminal for receiving said fine reference voltage and said second amplification means and turned on only in response to the fourth clock signal generated by said clock signal generation means.

7. A voltage comparator as recited in claim 4, wherein said first amplification means includes:

a first capacitor storing the potential difference between the potential of the analog input signal and the coarse reference voltage from said first input means;

a first inverter for inverting and amplifying the output voltage of said first capacitor; and first switching means connected between the input node and the output node of said first inverter and turned on only in response to the first clock signal generated by said clock signal generation means, and said second amplification means includes:

a second capacitor for storing the potential difference between the potential of the analog input signal and the fine reference voltage from said second input means;

a second inverter for inverting and amplifying the output voltage of said second capacitor; and second switching means connected between the input node and the output node of said second inverter and turned on only in response to the first clock signal generated by said clock signal generation means.

8. A voltage comparator as recited in claim 3, wherein said amplification means includes:

a first capacitor having its input electrode connected to the output of said first voltage signal generation means;

a second capacitor having its input electrode connected to the output of said second voltage signal generation means;

an inverter for inverting and amplifying the output voltages of said first and second capacitors; and switching means connected between the input node and the output node of said inverter and turned on in response to the third clock signal generated by said clock signal generation means, for resetting the offset voltage of said inverter.

9. A voltage comparator for comparing the potential of an analog input signal and reference voltages of p stages ($p \geq 3$), comprising:

a plurality of voltage signal generation means provided correspondingly to said p stages each for sequentially generating a voltage signal corresponding to the difference between said input analog signal and a corresponding reference voltage;

amplification means having a plurality of input nodes coupled to each said plurality of voltage signal generation means for sequentially amplifying said generated voltage signals; and resetting means for resetting the offset voltage of said amplification means before generation of each said voltage signal.

10. A voltage comparator as recited in claim 9, wherein said amplification means includes:

a plurality of capacitors each having an input electrode connected to a corresponding voltage signal generation means;

an inverter having one input node and one output node, said input node being connected to the output electrode of each said capacitor; and switching means connected between the input node and the output node of said inverter and turned on before amplifying each said voltage signal by said resetting means.

11. A subranging A/D converter A/D converting the voltage of an analog input signal by dividing the voltage into two stages of a plurality of more significant bits and a plurality of less significant bits, comprising:

reference voltage generation means for generating coarse reference voltages of a plurality of stages for generating said plurality of more significant bits and fine reference voltages of a plurality of stages for generating said plurality of less significant bits;

a plurality of first voltage signal generation means provided correspondingly to said coarse reference voltages of the plurality of stages, each for generating a first voltage signal corresponding to the difference between said analog input signal and a corresponding coarse reference voltage in a coarse comparison period;

a plurality of second voltage signal generation means provided correspondingly to said fine reference voltages of the plurality of stages, each for generating a second voltage signal corresponding to the difference between said analog input signal and a corresponding fine reference voltage in a fine comparison period;

a plurality of amplification means coupled to the outputs of first and second voltage signal generation means of corresponding stages among said plurality of first and second voltage signal generation means, for sequentially amplifying said generated first and second voltage signals;

resetting means for resetting the offset voltages of each of said first and second voltage signal generation means and the amplification means before amplifying said first and second voltages;

means for generating data of more significant bits by encoding the first voltage signal amplified by each said amplification means;

means for generating data of less significant bits by encoding the second voltage signal amplified by each said amplification means; and correction means responsive to said generated less significant bit data for correcting the data of more significant bits.

12. A voltage comparator for comparing a potential of an analog input signal to potentials of a coarse reference voltage for generating more significant bits in a subranging A/D converter and a fine reference voltage for generating less significant bits, comprising:

at least first and second voltage signal generation means provided correspondingly to said coarse and fine reference voltages for generating voltage signals corresponding to differences between the potential of the analog input signal and the potential of the coarse and fine reference voltages;

amplification means connected to outputs of said first and second voltage signal generation means, for sequentially amplifying said voltage signals generated in a time dividing manner; and resetting means for resetting the offset voltages of said first and second voltage signal generation means and said amplification means, wherein said resetting means includes a clock signal generation means for generating a first clock signal for resetting the offset voltages of said first and second voltage signal generation means, a second clock signal for comparing the potential of the analog input signal and the coarse reference voltage, a third clock signal for resetting the offset voltage of said amplification means, and a fourth clock signal for comparing the potential of the analog input signal and the fine reference voltage.

13. A voltage comparator for comparing a potential of an analog input signal to potentials of reference voltages of p stages ($p \geq 3$), comprising:

a plurality of voltage signal generation means provided correspondingly to the p stages, each for sequentially generating a voltage signal corresponding to a difference between said input analog signal and a corresponding reference voltage;

amplification means having a plurality of input nodes coupled to each of said plurality of voltage signal generation means for sequentially amplifying said generated voltage signals, wherein said amplification means includes
a plurality of capacitors, each having an input electrode connected to a corresponding voltage signal generation means,
an inverter having one input node and one output node, said input node being connected to the output electrode of each of said plurality of capacitors,
switching means connected between the input node and the output node of said inverter; and resetting means for resetting the offset voltage of said amplification means before generation of each said voltage signal, said switch means of said amplification means being turned on before amplifying each said voltage signal by said resetting means.

14. A voltage comparator for comparing a potential of an analog signal to potentials of a plurality of reference voltages comprising:

pulse signal generation means for generating a plurality of pulse signals having pulse widths to determine a comparison period for comparing the potential of said analog signal and the potential of each said reference voltage, at an interval of a prescribed resetting period;

a plurality of comparison means corresponding to said plurality of reference voltages, each comparison means being responsive to a corresponding pulse signal of said plurality of pulse signals for comparing the potential of said analog signal to the potential of a corresponding reference voltage during the comparison period;

amplification means having an output node commonly connected to the outputs of said plurality of comparison means for amplifying the output of each said comparison means during said comparison period; and resetting means for resetting the offset voltage of said amplification means in each of said prescribed resetting period.

15. A voltage comparator for comparing a potential of an analog signal to potentials of a plurality of reference voltages, comprising:

means for generating a plurality of pulse signals, each pulse signal defining an interval having a predetermined period within a prescribed period;

means, responsive to every other pulse signal among said plurality of pulse signals, for comparing the potential of the analog signal to the potential of one of said plurality of reference voltages during said predetermined period, the potential of the analog signal being compared to the potential of each one of said plurality of reference voltages during said prescribed period to output a plurality of output signals;

amplification means, coupled to said comparing means, to receive all of said plurality of output signals, for amplifying the output signal outputted during the corresponding predetermined period of every other pulse signal; and resetting means for resetting an offset voltage of said amplification means during said predetermined period of said pulse signal in between said every other pulse signal.

* * * * *